United States Patent
Mirgorodski et al.

(10) Patent No.: US 6,982,907 B1
(45) Date of Patent: Jan. 3, 2006

(54) RETENTION IMPROVEMENT TECHNIQUE FOR ONE TIME PROGRAMMABLE NON-VOLATILE MEMORY

(75) Inventors: Yuri Mirgorodski, Sunnyvale, CA (US); Peter J. Hopper, San Jose, CA (US); Vladislav Vashchenko, Palo Alto, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 11/044,965

(22) Filed: Jan. 27, 2005

(51) Int. Cl.
*G11C 16/04* (2006.01)
(52) U.S. Cl. .............................. 365/185.28; 365/185.22
(58) Field of Classification Search .......... 365/185.28, 365/185.22
See application file for complete search history.

(56) References Cited

U.S. PATENT DOCUMENTS

| | | | | |
|---|---|---|---|---|
| 4,486,769 A | * | 12/1984 | Simko | 365/185.28 |
| 4,698,787 A | | 10/1987 | Mukherjee et al. | 365/185 |
| 5,677,867 A | * | 10/1997 | Hazani | 365/185.01 |
| 6,137,723 A | | 10/2000 | Bergemont et al. | 365/185.18 |

* cited by examiner

*Primary Examiner*—Tuan T. Nguyen
(74) *Attorney, Agent, or Firm*—Stallman & Pollock LLP

(57) ABSTRACT

A programming technique for a one-time-programmable non-volatile memory (NVM) utilizes a repeated programming cycle with an interval between cycles that is long enough to redistribute charge in the layers surrounding the floating gate of the cell. Each cycle programs the floating gate and also the surrounding layers. The cycling saturates in an equilibrium state when the electric field form outside to the floating gate equals zero. This technique eliminates the first stage of conventional VT drop in NVM cells and, thus, improves retention.

4 Claims, 3 Drawing Sheets

RETENTION IMPROVEMENT TECHNIQUE FOR ONE TIME PROGRAMMABLE NON-VOLATILE MEMORY

TECHNICAL FIELD

The present invention relates to a methodology for improving the retention properties of a non-volatile memory (NVM) cell by saturation of charge in the layers surrounding the cell's floating gate during the programming operation.

DESCRIPTION OF THE INVENTION

Figure 1:
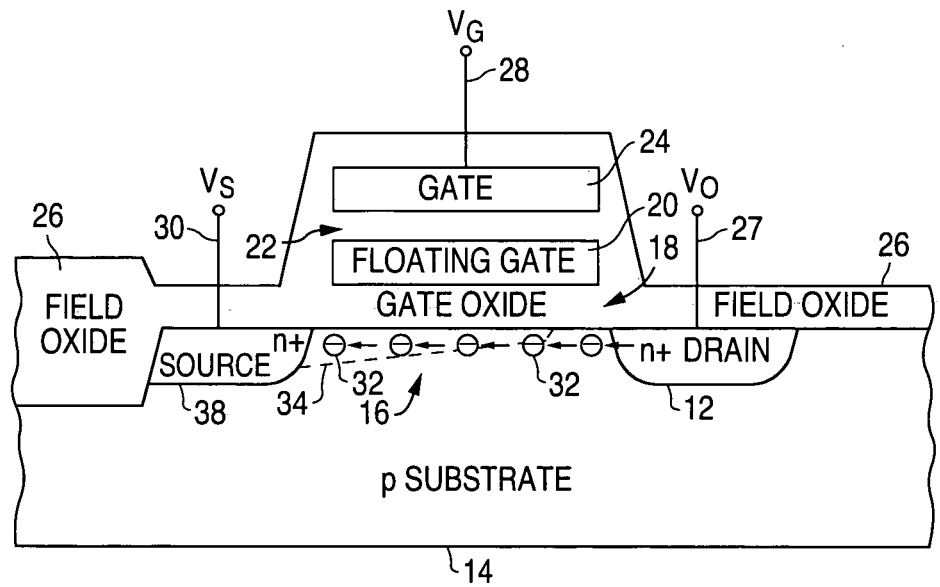
FIG. 1 is a partial cross section drawing illustrating a conventional electrically programmable read only memory (EPROM) cell structure.

U.S. Pat. No. 4,698,787, issued on Oct. 6, 1987, discloses as prior art the conventional electrically programmable read only memory (EPROM) device structure shown in FIG. 1. The FIG. 1 EPROM transistor device includes a source 10 and a drain 12 formed on a substrate 14. The source 10 and the drain 12 define a channel 16 in the substrate 14. Positioned above the channel 16 is a layer of insulating material that forms a gate dielectric layer 18. A floating gate 20 of semiconductor material is formed over the gate dielectric layer 18. A second layer 22 of insulating material is formed over the floating gate 20. Finally, a layer of semiconductor material is formed over the second layer of insulating material 22 to form a control gate 24. Field oxide 26 isolates the transistor structure from periphery devices. Electrical connections 26, 28 and 30 are provided for applying voltages to the drain 12, gate 24, and source 10, respectively.

Programming of the FIG. 1 EPROM cell is accomplished by raising the potential of the drain 12 (e.g. 8–12V), holding the source 10 at ground and applying a programming voltage pulse (e.g., approximately 13–21V) to the control gate 24 for a preselected period of time (e.g., 1–10 milliseconds). The result of these conditions is that a conductive region is established in the channel 16 across which electrons 32 are accelerated. The conductive region is designated by the dashed line 34 in FIG. 1. The magnitude and polarity of the voltages applied to the drain 12, the source 10 and the gate 24 are such that this conductive region is "pinched off" in a region adjacent to the drain 12. This causes electrons 32 to be raised sufficiently in potential so that they become "hot." These "hot" electrons create additional electron/hole pairs by impact ionization. In this condition, these electrons are elevated to an energy level that permits them to overcome the insulating properties of the gate dielectric 18. The hot electrons can thus "jump" the potential barrier of the gate dielectric 18. Due to the electric field created by the control gate, the hot electrons are attracted to the floating gate 20 where they are stored, thereby programming the cell.

Figure 2:
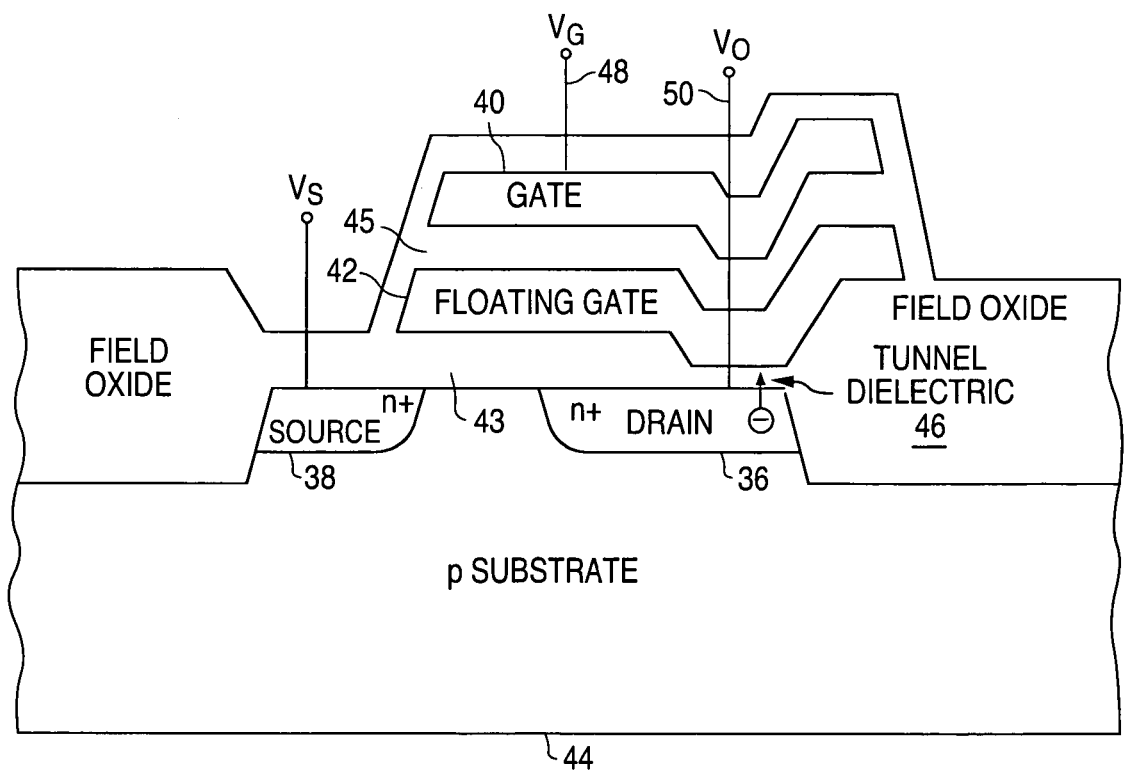
FIG. 2 is a partial cross section drawing illustrating a conventional electrically erasable programmable read only memory (EEPROM) cell structure.

The above-cited '787 patent also discloses a programming mechanism for an electrically erasable programmable read only memory (EEPROM), shown in FIG. 2. The EEPROM cell structure shown in FIG. 2 utilizes a different programming mechanism than does the EPROM cell described above. As with the EPROM structure, the EEPROM structure includes a drain 36, a source 38, a floating gate 32 separated from the substrate by a gate oxide layer 43, a gate 40 separated from the floating gate 32 by another layer of oxide 45, all of which are deposited or thermally grown. However, the EEPROM structure differs from the EPROM structure in that it provides a thin tunnel dielectric 46 between the drain 36 and the floating gate 42. As shown in FIG. 2, the portion of the floating gate that is positioned above the tunnel dielectric 46 is positioned on the drain region 36. Further, the portion of the gate 40 that is aligned with the tunnel dielectric 46 is also positioned on the drain 36. Programming (and erasing) of this structure is achieved by inducing potential differences between the gate 48 and drain 50 that are on the order of 20V. The thin dielectric region coupled with the high voltage between the gate 48 and the drain 50 induces "Fowler-Nordheim tunneling."

To program the FIG. 2 cell, i.e. to place electrons on the floating gate 42, the drain region 50 is held at ground potential while the gate 48 is pulsed for approximately 10 milliseconds at a potential of approximately 20V. During the programming operation, the source region 38 is allowed to float. Under these conditions, electrons tunnel through the tunnel dielectric 46 to the floating gate 42.

Figure 3A:
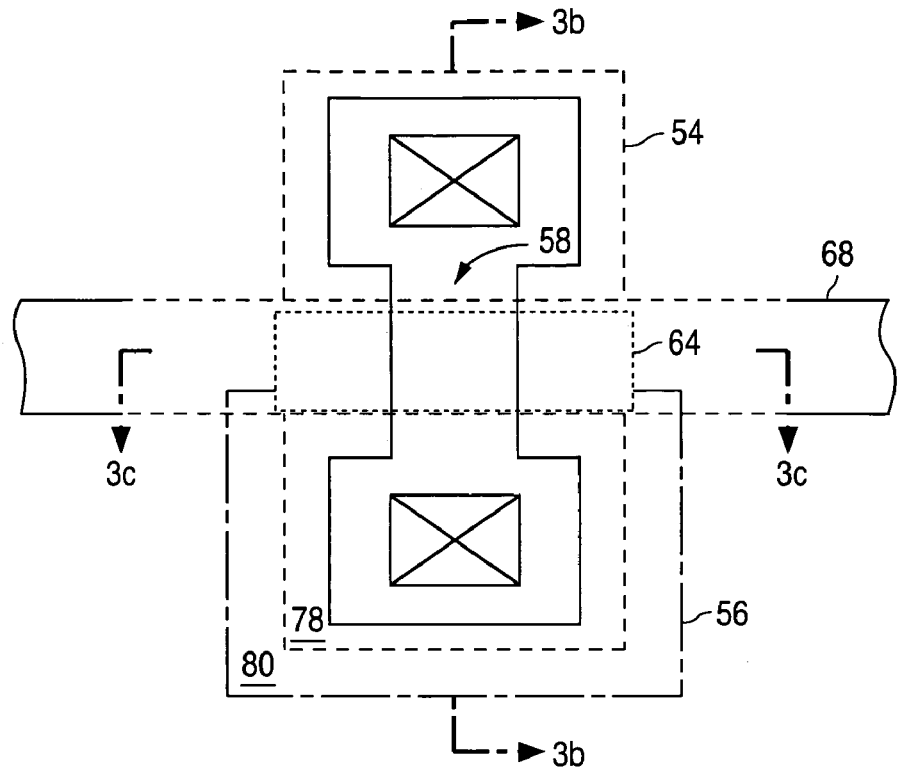
FIGS. 3a and 3b are, respectively, a plan view and partial cross section drawing illustrating an alternate embodiment of a conventional EEPROM cell.
Figure 3B:
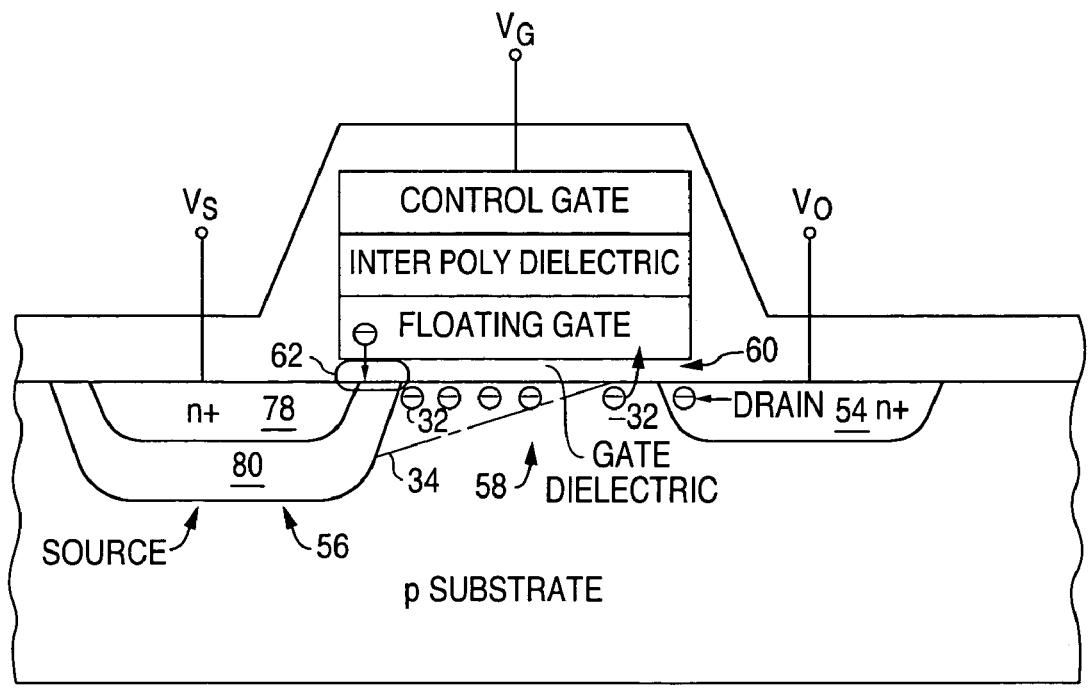

The '787 patent also discloses another EEPROM cell structure, shown in FIGS. 3a and 3b. In this structure, a relatively shallow drain region 54 and a deeper source region 56 are formed in a silicon substrate 52. A channel 58 is defined between the source 56 and the drain 54. A gate dielectric 60 is formed over the channel 58 and extends over the channel 58 and to extend between the drain 54 and to overlap a portion 62 of the source 56. The gate dielectric 60 has a relatively uniform thickness over its entire cross section. A floating gate 64 is formed over the gate dielectric 60. A second layer of dielectric material 66 is formed over the floating gate 64. A control gate 68 is formed over the seconfd layer of insulating material 66.

Programming of the cell shown in FIGS. 3a and 3b is achieved by raising the drain region 54 and the control gate 68 to predetermined potentials above that of the source region 56. For example, in one programming scheme, the drain 54 is raised to between 4–6V, while the control gate 68 is pulsed at about 10–12V for approximately 0.5–5 msec. Under these conditions, "hot" electrons are generated and accelerated across the gate dielectric and onto the floating gate. Thus, the programming operation for this cell is similar to that of a conventional EPROM cell.

U.S. Pat. No. 6,137,723, issued on Oct. 24, 2000, discloses a so-called "Frohmann-Bentchkowsky" memory transistor, shown in FIG. 4. The FIG. 4 device includes spaced-apart p-type source region 70 and drain region 72 formed in an n-well 74, which in turn is formed in a p-type silicon substrate 76. A channel region 78 is defined between the source region 70 and the drain region 72 and a layer of gate oxide 80 is formed over the channel region 78. A gate 82 is formed over the gate oxide layer 80. A layer of insulating material 84 along with gate oxide 80 encapsulates the floating gate 82.

Figure 4:
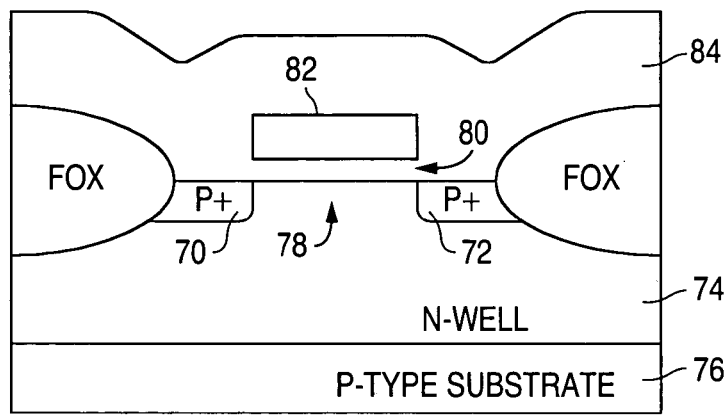
FIG. 4 is a partial cross section drawing illustrating a conventional Frohmann-Bentchkowsky EPROM cell.

The FIG. 4 cell is programmed by applying biasing voltages to the well 74 and to the drain region 72 that are sufficient to induce avalanche breakdown. For example, avalanche breakdown is induced by applying ground to the well 74 and a negative breakdown voltage to the drain 72, while either grounding or floating the source region 70, or by applying a positive breakdown voltage to the well 74 and ground to the drain 72, while floating or applying the positive breakdown voltage to the source 70. The baising voltages that are sufficient to induce avalanche breakdown establish a strong electric field across the drain-to-well junction depletion region. The strong electric field accelerates electrons in the junction depletion region into substrate hot electrons. A number of these substrate hot electrons penetrate the gate oxide layer 80 and accumulate on the floating gate 82, thereby programming the cell.

Figure 5:
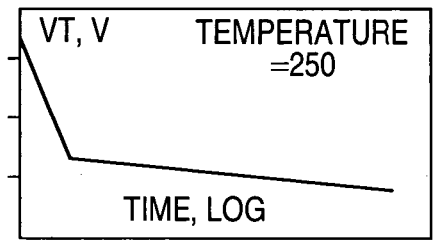
FIG. 5 is a plot presenting typical dependence of VT vs. time for a programmed non-volatile memory (NVM) cell.

Each of the cells described above is exemplary of a programming scheme for a non-volatile memory (NVM) cell. One of the basic properties of NVM cells is the ability to maintain charge on the floating gate within a required period of time (retention). The method to control retention is to monitor the threshold voltage VT of the cell over time. A typical dependence of VT versus time is presented in FIG. 5. The FIG. 5 plot shows two mechanisms in effect with different characteristics that are commonly attributed to two leakage mechanisms: an initial leakage mechanism that leads to a significant VT shift within a short time (seconds or minutes) followed by a more gradual decrease in VT over a much longer period of time (e.g. 10 years).

Figure 6:
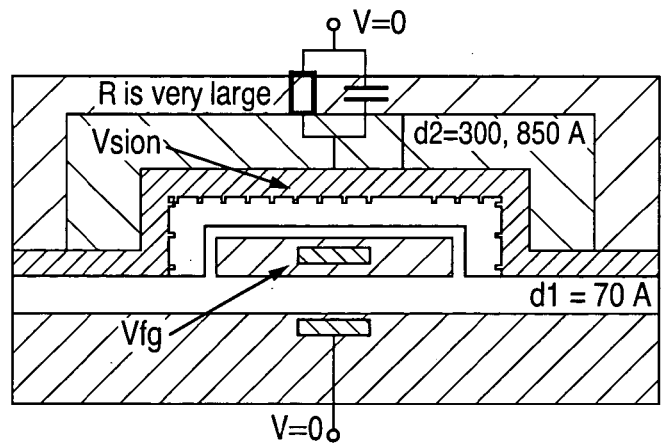
FIG. 6 is a partial cross-section drawing illustrating a programmed NVM cell and corresponding electrical model, in accordance with the concepts of the present invention.

The present invention is based upon the concept that the initial radical VT shift is not related to leakage fro the floating gate, but rather may be attributed to charge redistribution in the dielectric layers/interfaces that surround the floating gate that effect the floating gate voltage due to capacitive coupling, as shown in FIG. 6. That is, after programming, the floating gate has a negative voltage that results in an electric field directed to the floating gate. This electric field forces positive charges to move toward the floating gate where they can be trapped at some of the interfaces. This process stops when the amount of trapped charge is sufficient to reduce the electric field outside the interface to zero. After erasing, the mechanism works in the same way.

In FIG. 6, the polysilicon floating gate electrode is formed on gate oxide which, in turn, is formed on the composite. Additional oxide and plasma enhanced TEOS (PETEOS) insulates the floating gate, as does surrounding SION and PETEOS.

Thus, the present invention is directed to one-time-programmable NVM applications wherein the programming operation is performed in fabrication of the NVM device and only once. The programming method utilizes a repeated programming cycle with an interval between cycles that is long enough to enable a redistribution of charge in the layers surrounding the floating gate. At room temperature, this cycle period may be about once a day; at temperatures of 200–250° C., it may be accelerated, to about once per 30 minutes or shorter.

Figure 7:
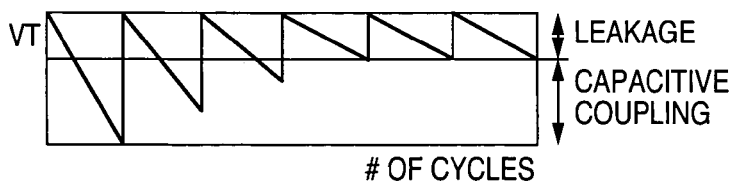
FIG. 7 is a plot presenting VT vs. programming cycles for an NVM cell in accordance with the present invention.

With reference to FIG. 7, each programming cycle programs the floating gate of the device, in a manner as described above that is consistent with the structure and programming bias conditions of the type disclosed above, and also the surrounding layers as shown in FIG. 6. This programming cycling will saturate in an equilibrium state when the electric field from outside the floating gate is equal to zero, as illustrated in FIG. 7. This eliminates the first dramatic stage of VT drop (see FIG. 5) and, thus, improves retention.

Instead of the cycling described above in conjunction with FIG. 7, a slow ramp of programming control gate voltage may be used. The character time of this ramp should be equivalent to a few programming cycles.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A method of programming a non-volatile memory (NVM) cell, the NVM cell including a drain region having a first conductivity type formed in a semiconductor substrate having a second conductivity type opposite the first conductivity type, a source region having the first conductivity type formed in the semiconductor substrate and spaced apart from the drain region to define a substrate channel region therebetween, a layer of gate dielectric material formed over the channel region, a conductive floating gate formed on the layer of gate dielectric material, and a conductive control gate formed over the floating gate and electrically insulated therefrom by intervening dielectric material, the method comprising:

raising the potential of the drain region to a first preselected potential above the potential of the source region;

performing a programming step by applying a first programming potential to the control gate to facilitate the flow of electrons to the floating gate;

repeating the programming step for a plurality of programming cycles with a time interval between cycles long enough to redistribute charge in the dielectric layers surrounding the floating gate and until the electric field from outside the floating gate is substantially zero.

2. A method as in claim 1, and wherein the semiconductor substrate comprises silicon.

3. A method as in claim 2, and wherein the conductive floating gate comprises polysilicon at the gate dielectric material comprises silicon oxide.

4. A method as in claim 3, and wherein the control gate comprises polysilicon.

* * * * *